(12) United States Patent
Phillips

(10) Patent No.: US 7,709,732 B2
(45) Date of Patent: May 4, 2010

(54) CARBON NANOTUBES LITZ WIRE FOR LOW LOSS INDUCTORS AND RESONATORS

(75) Inventor: James P. Phillips, Lake in the Hills, IL (US)

(73) Assignee: Motorola, Inc., Schaumburg, IL (US)

( * ) Notice: Subject to any disclaimer, the term of this patent is extended or adjusted under 35 U.S.C. 154(b) by 459 days.

(21) Appl. No.: 11/609,354

(22) Filed: Dec. 12, 2006

(65) Prior Publication Data

US 2008/0136551 A1  Jun. 12, 2008

(51) Int. Cl.
*H01B 11/04* (2006.01)
(52) U.S. Cl. .................................. 174/36
(58) Field of Classification Search ............. 174/36, 174/110 R, 110 FC
See application file for complete search history.

(56) References Cited

U.S. PATENT DOCUMENTS

| | | | | |
|---|---|---|---|---|
| 2,180,413 A | * | 11/1939 | Harvey | 336/87 |
| 2,267,173 A | * | 12/1941 | Schaper | 455/146 |
| 2,511,327 A | * | 6/1950 | Bussard | 455/285 |
| 4,673,888 A | * | 6/1987 | Engelmann et al. | 330/10 |
| 5,445,635 A | * | 8/1995 | Denen et al. | 606/27 |
| 2002/0163414 A1 | * | 11/2002 | Mayer et al. | 336/199 |
| 2003/0002559 A1 | * | 1/2003 | Fishman et al. | 373/146 |
| 2003/0135971 A1 | * | 7/2003 | Liberman et al. | 29/419.1 |
| 2007/0257859 A1 | * | 11/2007 | Lashmore et al. | 343/897 |

* cited by examiner

*Primary Examiner*—William H Mayo, III
(74) *Attorney, Agent, or Firm*—Bryan W. Bockhop; Bockhop & Associates, LLC

(57) ABSTRACT

An upper frequency-range circuit (160) includes a load element (168) exhibiting a capacitive load impedance. A first matching network (166) includes at least one nano-scale Litz wire (100) inductor. The first matching network (166) exhibits an inductive reactance that nominally matches the capacitive load reactance. An electrical conductor for providing connections for radio-frequency signals includes a plurality of nano-scale conductors (120) that are arranged in the form of a Litz wire (100). In one method of making a Litz wire (142), a plurality of carbon nanotubes (144) is placed on a substrate (146). The carbon nanotubes (144) are woven according to a predefined scheme so as to form a Litz wire (142). An inductor may be formed by manipulating the Litz wire (100) to form a coil (150).

4 Claims, 2 Drawing Sheets

CARBON NANOTUBES LITZ WIRE FOR LOW LOSS INDUCTORS AND RESONATORS

BACKGROUND OF THE INVENTION

1. Field of the Invention

The present invention relates to electronic wiring components and, more specifically, to a nano-scale conductor Litz wire used in ultra-high frequency applications.

2. Background of the Invention

Alternating electric currents tend to distribute themselves within a conductor so that the current density near the surface of the conductor is greater than the current density nearer to the center. This phenomenon is often referred to as the "skin effect." In high frequency applications, the skin effect becomes more pronounced, especially in such devices as inductors and transformers, resulting in a substantial power loss.

The skin effect may be reduced by use of a Litz wire (short for "Litzendraht wire"), which consists of a plurality of relatively thin wires that are individually coated with an insulating film and then woven or braided. By doing so, a Litz wire increases the overall surface area of the conductor, thereby reducing the overall skin effect in the resulting cable. Also, in a Litz wire, the ratio of impedance to resistance is increased, relative to a solid conductor having the same cross sectional area, resulting in a higher Q factor at higher frequencies. Q factor is a measure of energy dissipation in resonant systems in which a higher Q factor indicates less energy dissipation.

At high UHF frequencies, conductor losses increase due to the skin effect, even with conventional copper Litz wires. This is because at UHF frequencies, the skin effect in the individual strands become so pronounced that the overall power loss becomes significant. One solution to this problem would be to create list wires using ultra-fine copper wires. However, the required diameter of a copper wire used as a component wire of a Litz wire for UHF applications would be so fine that it would not be able to withstand the stresses imparted on it as a result of conventional manufacturing processes and ordinary use.

As antennas used in communications are miniaturized for inclusion in integrated circuits, they exhibit proportionally more capacitance than their larger-scale counterparts. This capacitance must be matched with an inductance for such antennas to be useful in communications circuits. Currently, the minimum size of an antenna is limited by the amount of inductance that can be used to match the capacitance exhibited by the antenna. A similar problem exists when trying to miniaturize amplifiers. However, no inductor exists that is both small enough to work effectively with a miniature amplifier or antenna and capable of providing sufficient inductance to match the capacitance of the miniature antenna or amplifier.

Carbon nanotubes are molecular-scale tubes of graphitic carbon. They were first synthesized using a carbon arc evaporator in 1991. Initially, such tubes contained at least two layers and often many more.

A class of carbon nanotube, the single-walled nanotube (also referred to as "SWNT"), was discovered in 1993. Single walled nanotubes are generally narrower than the multi-walled tubes and have a range of exceptional physical properties, both in terms of strength and in the manner in which they conduct electricity.

Carbon nanotubes employ a graphitic molecular structure and employ $sp^2$ carbon bonds, in which each atom is joined to three neighbors. A carbon nano-tube is essentially a rolled-up single graphitic layer in which the atoms along one edge of a graphitic layer bond to their corresponding atoms along the opposite edge.

There are several configurations of carbon nanotubes, that depend on the amount of heliecity (degree to which a helical structure is exhibited) found in the structure of the atoms in the nanotube. One configuration, referred to as the "armchair" configuration, exhibits little heliecity; whereas another configuration, referred to as the "chiral" configuration have six atom carbon hexagons arranged in a helix. The structure of the nanotube determines some of its physical properties.

Currently, the arc-evaporation method produces the highest quality nanotubes. It involves passing a large current through two graphite electrodes in an atmosphere of helium. Some of the graphite in the electrodes vaporizes and then condenses on the walls of the reaction vessel and on one of the electrodes (the cathode). Single-walled nanotubes are produced when cobalt and nickel is added to one of the electrodes (the anode).

Carbon nanotubes may also be made by passing a carbon-containing gas at a suitable temperature and pressure over nano-scale particles of a catalyst (such as iron, nickel or cobalt). The particles help the breakdown the gaseous molecules into carbon, thereby causing a tube to grow with a metal particle at the tip. Another method for making carbon nanotubes involves using a powerful laser to vaporize a metal-graphite target. The catalysis method allows for accurate placement of the nanotubes and more direct control over the manner of their growth.

The strength of the carbon-carbon bonds in a nanotube gives them amazing mechanical properties. For example nanotubes can have a stiffness that is five times more than that of steel and have a tensile strength that is about fifty times that of steel. Yet on a per unit volume basis, they weigh about one-fourth that of steel.

Electrically, a carbon nanotube can act as either a conductor or a semi-conductor, depending on its configuration. In certain configurations, they move electrons through a ballistic charge transport mechanism. As a result, they experience minimal electrical resistance and, thus, generate a minimum amount of heat when conducting.

Therefore, there is a need for a conductor that exhibits minimal skin effect while being able to withstand ordinary stress from manufacturing and use.

There is also a need for a Litz wire that may be employed in passive components used in integrated circuits.

SUMMARY OF THE INVENTION

The disadvantages of the prior art are overcome by the present invention which, in one aspect, is an upper frequency-range circuit that includes a load element exhibiting a capacitive load impedance. A first matching network includes at least one nano-scale Litz wire inductor. The first matching network exhibits an inductive impedance that nominally matches the capacitive load impedance.

In another aspect, the invention is an electrical conductor for providing connections for radio-frequency signals. The conductor includes a plurality of nano-scale conductors that are arranged in the form of a Litz wire.

In another aspect, the invention is an inductor that includes a Litz wire. The Litz wire consists of a plurality of carbon nanotubes. The Litz wire is formed as a coil.

In another aspect, the invention is a method of making an inductor in which a plurality of carbon nanotubes is placed on a substrate. The carbon nanotubes are woven according to a predefined scheme so as to form a Litz wire. The Litz wire is formed into a coil.

In yet another aspect, the invention is a method of making a conductor for transmitting radio-frequency signals. A plurality of carbon nanotubes is placed on a substrate. The carbon nanotubes are woven according to a predefined scheme so as to form a Litz wire.

These and other aspects of the invention will become apparent from the following description of the preferred embodiments taken in conjunction with the following drawings. As would be obvious to one skilled in the art, many variations and modifications of the invention may be effected without departing from the spirit and scope of the novel concepts of the disclosure.

DETAILED DESCRIPTION OF THE INVENTION

Figure 1:
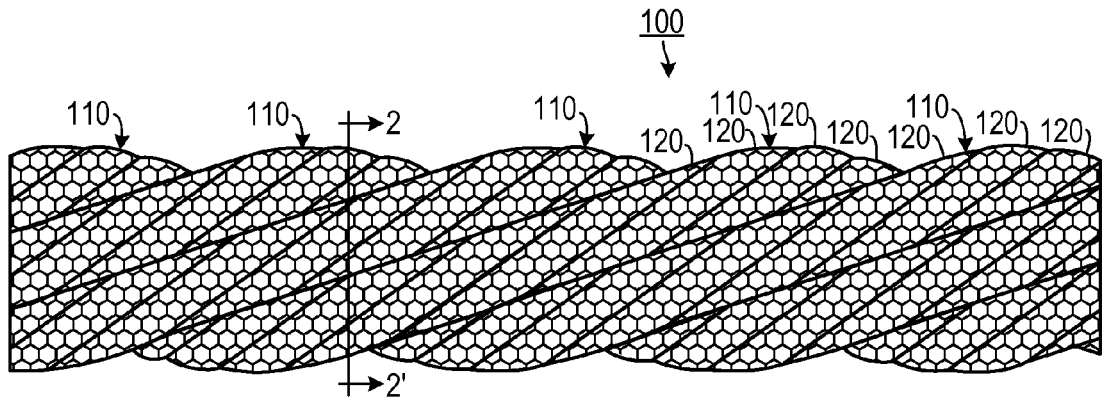
FIG. 1 is a side elevational view of a Litz wire constructed from carbon nanotubes.

A preferred embodiment of the invention is now described in detail. Referring to the drawings, like numbers indicate like parts throughout the views. As used in the description herein and throughout the claims, the following terms take the meanings explicitly associated herein, unless the context clearly dictates otherwise: the meaning of "a," "an," and "the" includes plural reference, the meaning of "in" includes "in" and "on."

Also, as used herein "upper frequency range" includes frequencies in the UHF and SHF ranges. Generally, a frequency above 300 MHz (such as a frequency in the range of from 800 MHz to 10 GHz) would be included in an upper frequency range.

Figure 2:
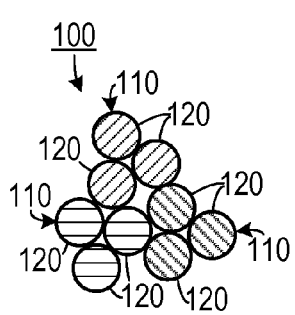
FIG. 2 is a cross sectional view of the Litz wire shown in FIG. 1, taken along line 2-2'.

As shown in FIGS. 1 and 2, one embodiment includes a Litz wire 100 that is woven from a plurality of nano-scale conductors 120. The nano-scale conductors 120 could be nanotubes (such as carbon nanotubes) or could be other types of nano-scale conductors, including nano-ribbons, nano-rods and nano-wires, or a combination thereof. The materials used to make the nano-scale conductors can include carbon graphene structures, metals, metal oxides and crystalline materials. Typically, in a carbon nanotube embodiment, armchair-type single-walled nanotubes (SWNTs) would be used in the Litz wire 100 if ballistic charge transport in the nanotube is desired. However, other types of nanotubes (e.g., chiral-type and multi-walled) could be used to take advantage of their respective electrical properties in relation to certain embodiments.

A helically woven "rope-twist" arrangement of a Litz wire 100 is shown in FIGS. 1 and 2. Several nano-scale conductors 120 are first woven or twisted into primary strands 110. The primary strands 110 are then twisted or woven together to form the Litz wire 100. Many different twisting schemes and weaving patterns may be employed so long as each of the individual nano-scale conductors 120 has essentially the same amount of surface area exposed in the outermost surface of the Litz wire 100.

Figure 3:
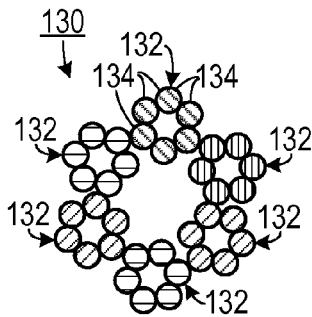
FIG. 3 is a cross sectional view of a many-stranded Litz wire.
Figure 4:
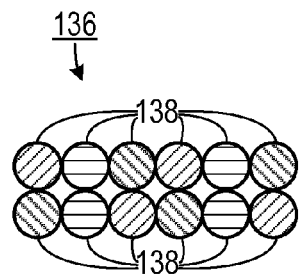
FIG. 4 is a cross-sectional view of a Litz wire having a rectangular cross section.

A more complex Litz wire 130 is shown (in cross-section) in FIG. 3. In this embodiment, six strands 132, each formed from six nano-scale conductors 134, are twisted together to form the Litz wire 130. A rectangular weave embodiment of a Litz wire 136 is shown (in cross-section) in FIG. 4. In this embodiment, the individual nano-scale conductors 138 may be woven together, such as with a "basket weave" pattern, and then pressed to form a rectangular cross-section.

Figure 5:
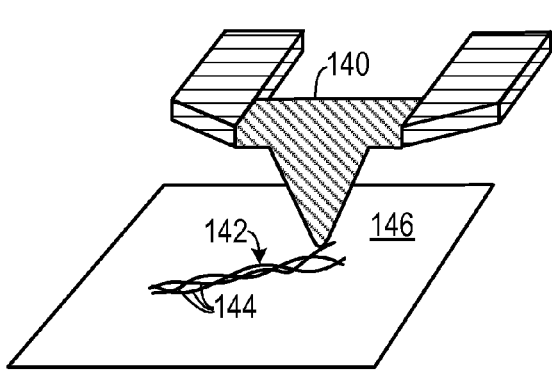
FIG. 5 is a schematic diagram of a cantilever-based probe arranging carbon nanotubes.
Figure 6:
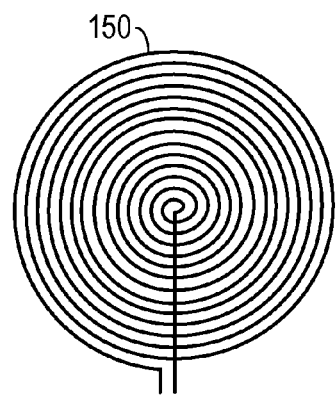
FIG. 6 is a plan view of a planar spiral inductor made from a Litz wire.

One method of making a Litz wire 142 is shown in FIG. 5, in which a plurality of nano-scale conductors 144 is disposed on a substrate 146. Each of the nano-scale conductors 144 is manipulated by a cantilever-based probe 140 to weave or twist them into a Litz wire 142. The manipulation of the nano-scale conductors 144 is done using conventional atomic force microscopy techniques. If a massively-parallel array of cantilever-base probes 140 is used, many Litz wires can be made simultaneously. Once the Litz wires are formed, they may be arranged into a useful structure, such as a planar spiral coil 150 (which may be used as an inductor), as shown in FIG. 6.

Figure 7:
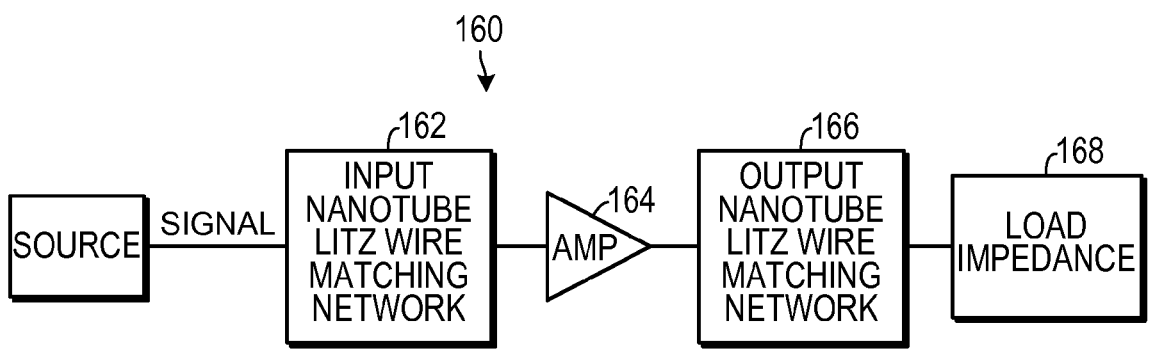
FIG. 7 is a schematic diagram of an active circuit that includes nanotube Litz wire matching networks.

One embodiment of an active upper frequency range circuit 160 is shown in FIG. 7. In this circuit 160, a signal is fed into a miniature amplifier 164 which feeds a load 168 having an impedance. Typically, the amplifier 164 would be constructed of nano-scale semiconductors, such as transistors, and would have a relatively high capacitance associated with the semiconductors. The impedance of the signal is matched to input impedance of the miniature amplifier 164 with an input nanotube Litz wire matching network 162. Similarly, the output impedance of the miniature amplifier 164 is matched to the impedance of the load 168 with an output nanotube Litz wire matching network 166. The matching networks 162 and 166 include nanotube Litz wire inductors, which may be in series with or parallel to the signal (or a combination of both, depending upon the specific application).

Figure 8:
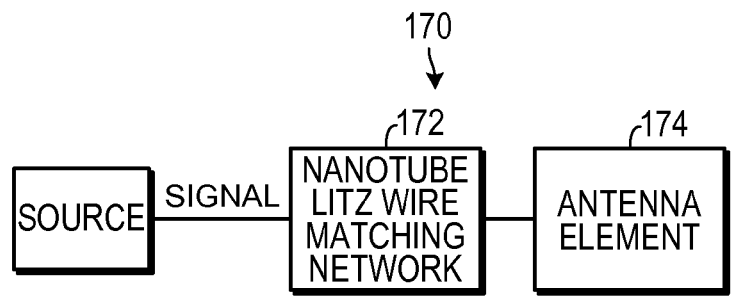
FIG. 8 is a schematic diagram of a passive circuit that includes a nanotube Litz wire matching network.

An embodiment of a passive circuit 170 is shown in FIG. 8. In the example shown, a signal is fed from a source to a miniature antenna element 174, such as a miniature dipole. Because of its scale, the antenna element 174 would exhibit relatively high capacitive reactance. A corresponding inductive reactance is required and, therefore, an inductive network using a nanotube Litz wire matching network 172 is used to cancel the reactance and present only a real impedance that matches the impedance of the source to the impedance of the antenna element 174.

The goal with frequency matching is for a circuit to have a high efficiency and thus have little power dissipated within the matching elements relative to the power that is transferred to the matched device. This requires that the operating circuit have a much lower Q when loaded than the Q of the individual elements comprising the matching circuit. This is done by maximizing the unloaded Q of both of the capacitive elements in the circuit and the Q of any inductive elements. As circuits are miniaturized, the reactance of the capacitive elements becomes relatively high requiring high inductive reactances with correspondingly high Q. Inductors made with conventional materials have lower Q's as they are reduced in size.

However, nanotube Litz wire inductors have a unloaded Q that approaches the unloaded Q of the capacitive elements, thereby making miniature higher frequency range circuits highly efficient and therefore feasible.

The embodiments disclosed above offer several advantages over conventional Litz wires, including: (1) the Litz wires have minimal skin effect, but are much stronger than metal wire-base Litz wires; (2) the thin cross-sectional area of nano-scale conductors allows for the production of extremely dense coils, which may be employed on integrated circuits and in UHF applications; and (3) many nano-scale conductors, such as carbon nanotubes, move current by ballistic charge transport, which results in minimal heat generation through resistance and reduced line delay.

The above described embodiments, while including the preferred embodiment and the best mode of the invention known to the inventor at the time of filing, are given as illustrative examples only. It will be readily appreciated that many deviations may be made from the specific embodiments disclosed in this specification without departing from the spirit and scope of the invention. Accordingly, the scope of the invention is to be determined by the claims below rather than being limited to the specifically described embodiments above.

What is claimed is:

1. An upper frequency-range circuit, comprising:
   a. a load element exhibiting a capacitive load impedance; and
   b. a first matching network that includes at least one nano-scale Litz wire inductor and that exhibits an inductive impedance that nominally matches the capacitive load impedance.

2. The high frequency circuit of claim 1, wherein the nano-scale Litz wire inductor comprises an inductor consisting essentially of carbon nanotubes.

3. The high frequency circuit of claim 1, wherein the capacitive load impedance comprises a miniature antenna element.

4. The high frequency circuit of claim 1, further comprising:
   a. an amplifier that exhibits a capacitive amplifier impedance; and
   b. an input nano-scale Litz wire matching network that matches the capacitive amplifier impedance to a signal impedance.

* * * * *